United States Patent
Lou et al.

(10) Patent No.: US 8,692,570 B2
(45) Date of Patent: Apr. 8, 2014

(54) PROBE CARD FOR TESTING HIGH-FREQUENCY SIGNALS

(75) Inventors: Choon Leong Lou, Hsinchu (TW); Chih Kun Chen, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 411 days.

(21) Appl. No.: 13/105,321

(22) Filed: May 11, 2011

(65) Prior Publication Data
US 2011/0279139 A1  Nov. 17, 2011

(30) Foreign Application Priority Data
May 17, 2010 (TW) .............................. 99115629 A

(51) Int. Cl.
*G01R 31/00* (2006.01)

(52) U.S. Cl.
USPC ............ 324/756.03; 324/755.07; 324/756.07

(58) Field of Classification Search
None
See application file for complete search history.

(56) References Cited

U.S. PATENT DOCUMENTS

| | | | |
|---|---|---|---|
| 6,242,930 B1 | 6/2001 | Matsunaga et al. | |
| 6,420,889 B1 * | 7/2002 | Terada | 324/750.27 |
| 7,295,023 B2 | 11/2007 | Lou et al. | |
| 7,368,928 B2 | 5/2008 | Lin et al. | |

* cited by examiner

*Primary Examiner* — Minh N Tang
(74) *Attorney, Agent, or Firm* — WPAT, P.C.; Anthony King; Kay Yang

(57) ABSTRACT

A probe card includes a circuit board, a flexible substrate, and a plurality of probes. The flexible substrate includes a plurality of arrayed conductive strips. The plurality of conductive strips is electrically connected to the printed circuit board. The plurality of probes is fixed to the printed circuit board, and the end of each probe is attached to one corresponding conductive strip.

9 Claims, 8 Drawing Sheets

PROBE CARD FOR TESTING HIGH-FREQUENCY SIGNALS

BACKGROUND OF THE INVENTION

1. Technical Field

The present invention relates to a probe card, and more particularly, to a probe card for testing high-frequency signals.

2. Background

Generally, it is necessary to test the electrical characteristics of integrated circuit devices at the wafer level to verify the performance of the integrated circuit device and to confirm the device satisfies the product specification. Integrated circuit devices with electrical characteristics satisfying the specification are selected for the subsequent packaging process, and the other devices are discarded to avoid incurring additional packaging cost. Another electrical property test is performed on the integrated circuit device after the packaging process is completed to screen out the below-standard devices to increase the product yield. In other words, the integrated circuit devices must undergo several electrical tests during the manufacturing process.

During testing, the probes of the probe card are moved to contact different devices or different pads of the same device, transmit test signals, and receive measured signals. As the integrated circuit device technology develops toward higher frequency and greater density, the probes must be designed with correspondingly greater density. In addition, the probe card must be equipped with proper shielding against EMI (electromagnetic interference) to prevent the probes from being interfered with by EMI.

FIG. 1 illustrates a conventional probe card 1 for testing high-frequency signals. The probe card 1 includes a high-frequency probe 11 fixed on a circuit board 12, a coaxial cable 13 electrically connecting one distal end 111 of the probe 11 to a signal terminal 121 of the circuit board 12, and a shield layer of the coaxial cable 13 electrically connected to a ground terminal 122 of the circuit board 12. To achieve effective shielding, the exposed portion of the distal end 111 of the probe 11 must be as short as possible, and the electrical connection between the probe 11 and the signal terminal 121 should be implemented by the coaxial cable 13 with high shielding ability.

The central conductor of the coaxial cable 13 is covered by a thick insulator to provide the desired impendence, and the thick insulator results in a large size of the coaxial cable 13. Consequently, although the probes 11 can be densely positioned for high-frequency testing, the large size of the coaxial cable 13 does not allow similarly dense positioning, and this kind of probe card 1 cannot be applied to high-frequency testing.

FIG. 2 illustrates another conventional probe card 2 for testing high-frequency signals. The probe card 2 includes a circuit board 22 and a coaxial probe 21 fixed on the circuit board 22, and the distal end of the coaxial probe 22 is connected to a signal terminal of the circuit board 22. The coaxial probe 22 includes a metal shielding layer 223 covering an insulating layer 221. Similar to the coaxial cable 13 shown in FIG. 1, the thick insulating layer of the coaxial probe 21 results in a large size, which cannot be positioned in a high density manner, and this kind of probe card 2 cannot be applied to high-frequency testing.

In addition, the conventional electrical connection, which uses the wires of the coaxial cables between the distal end of the probe and the circuit board, causes the distal ends of the probes to terminate at different positions, which increases the difficulty of connecting the probes to the circuit board. In particular, for the probes arranged with high density, the wires connected to the distal ends of the probes may push each other, causing a disorderly arrangement, which may influence the quality of the signal transmission.

SUMMARY

One aspect of the present invention provides a probe card for testing high-frequency signals.

A probe card according to this aspect of the present invention comprises a circuit board, a flexible substrate including a plurality of arrayed conductive strips electrically connected to the circuit board, and a plurality of probes fixed on the circuit board, wherein a distal end of each probe is connected to one corresponding conductive strip.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated by the following description and upon reference to the accompanying drawings in which.

DETAILED DESCRIPTION

Figure 1:
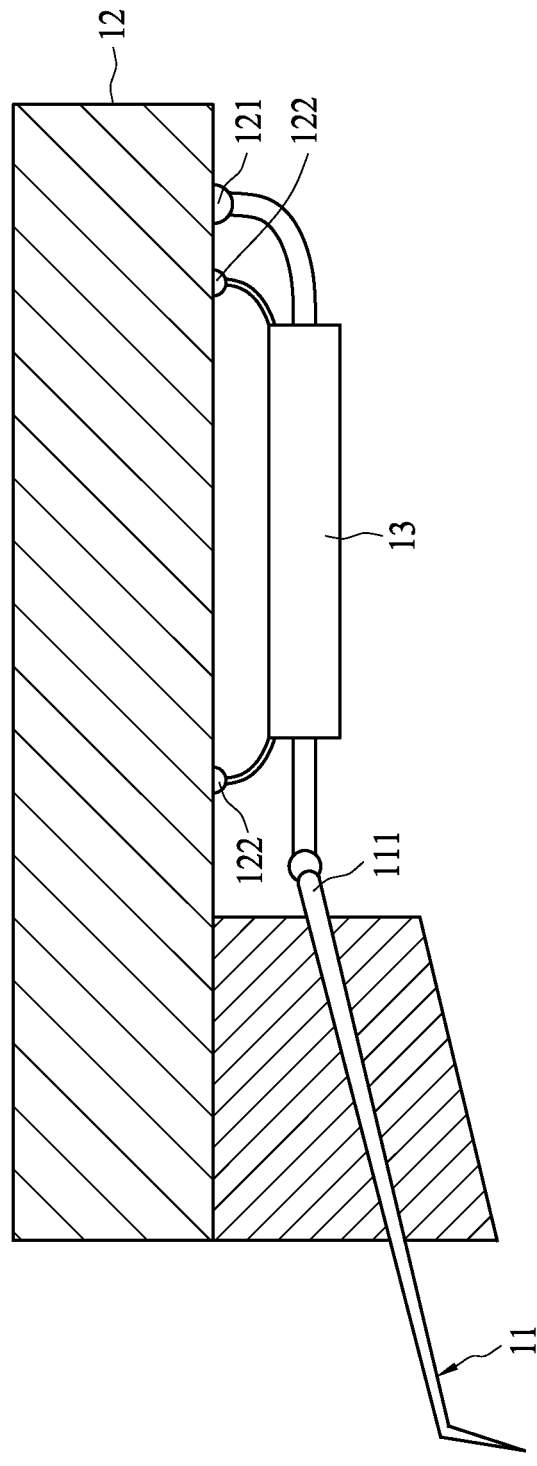
FIG. 1 illustrates a conventional probe card for testing high-frequency signals.
Figure 2:
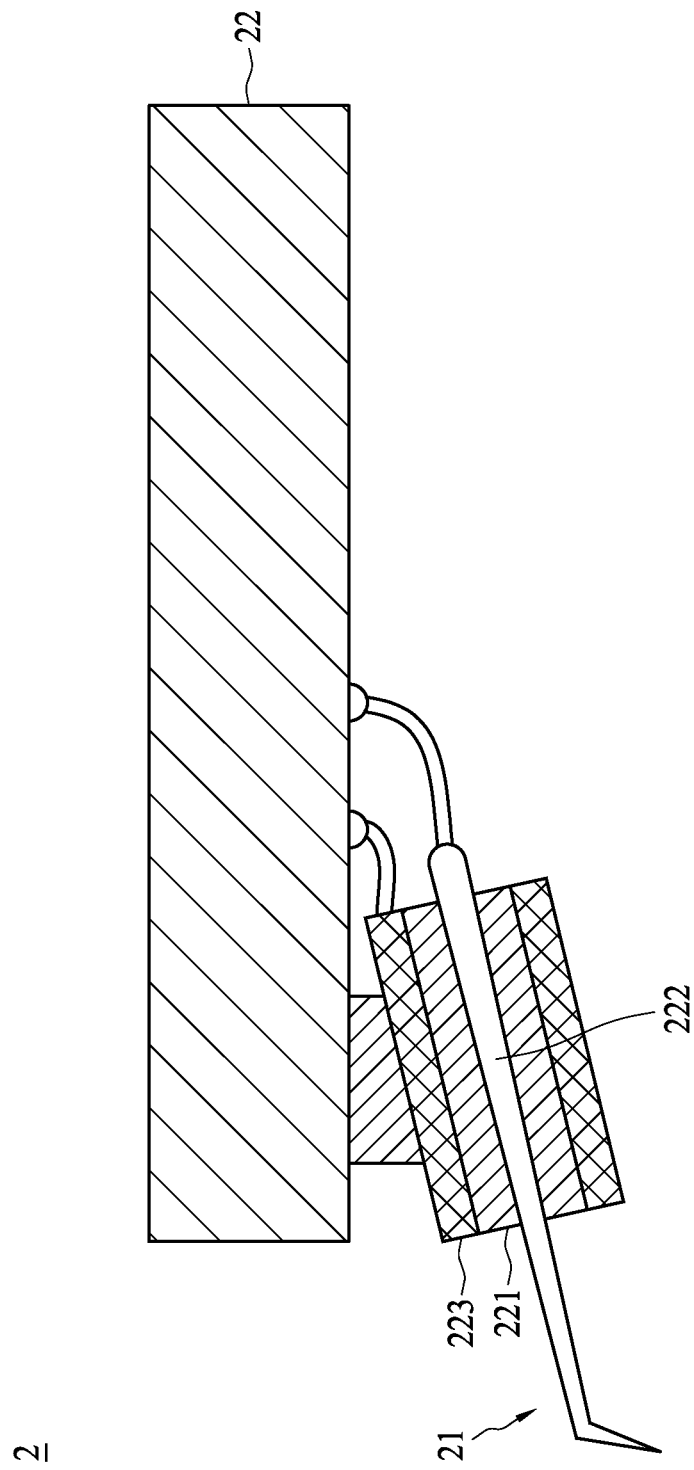
FIG. 2 illustrates another conventional probe card for testing high-frequency signals.
Figure 3:
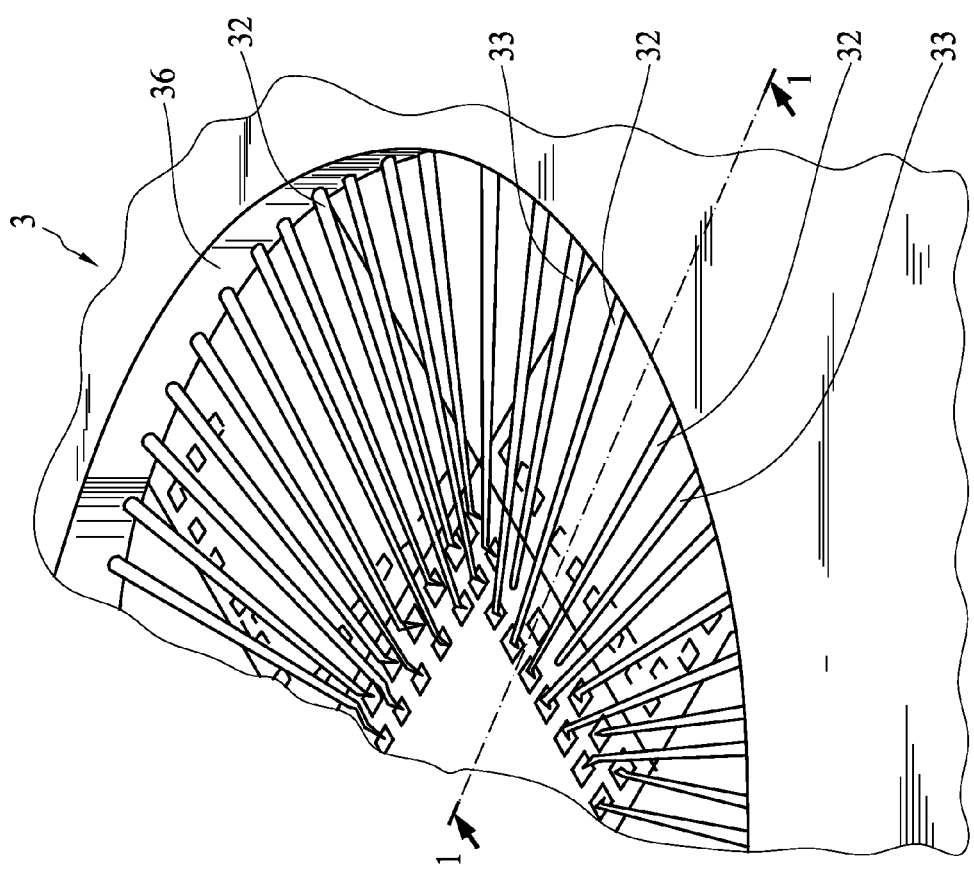
FIG. 3 is a schematic diagram showing a probe card according to one embodiment of the present disclosure.
Figure 4:
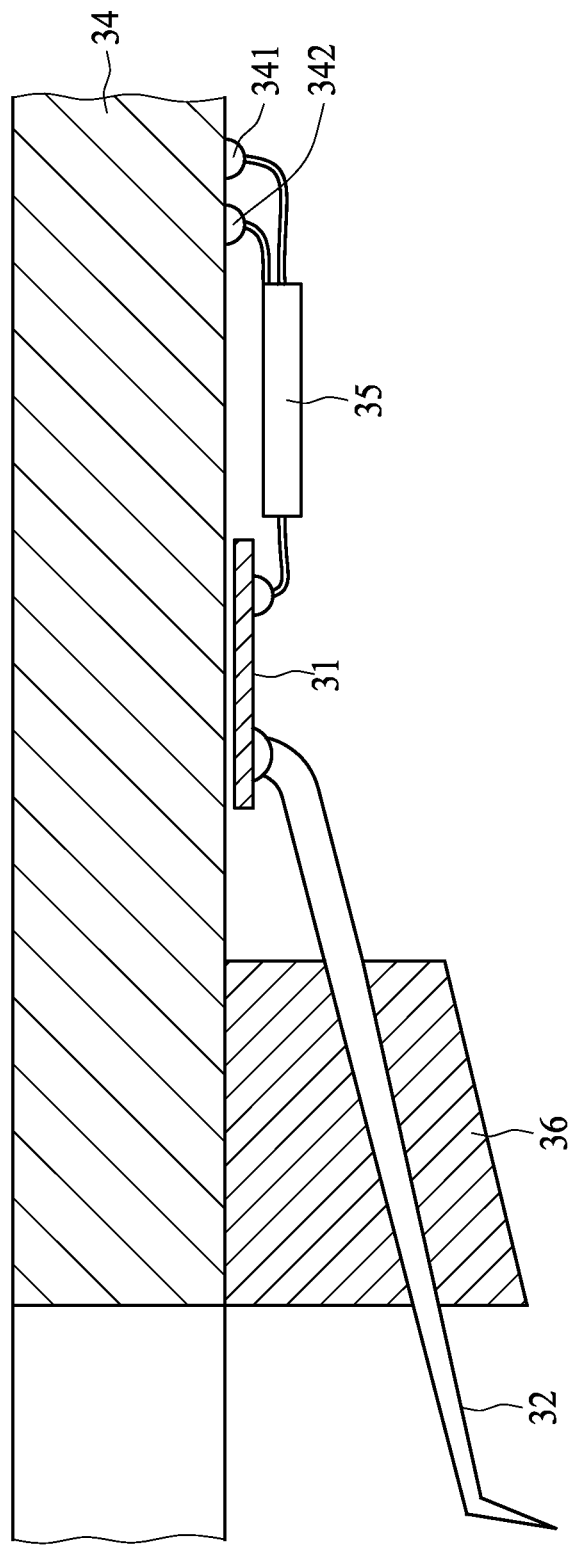
FIG. 4 is a cross-sectional view along line 1-1 of FIG. 3.

FIG. 3 is a schematic diagram showing a probe card 3 according to one embodiment of the present disclosure, and FIG. 4 is a cross-sectional view along line 1-1 of FIG. 3. The probe card 3 comprises a flexible substrate 31 and a plurality of probes 32, 33.

Figure 5:
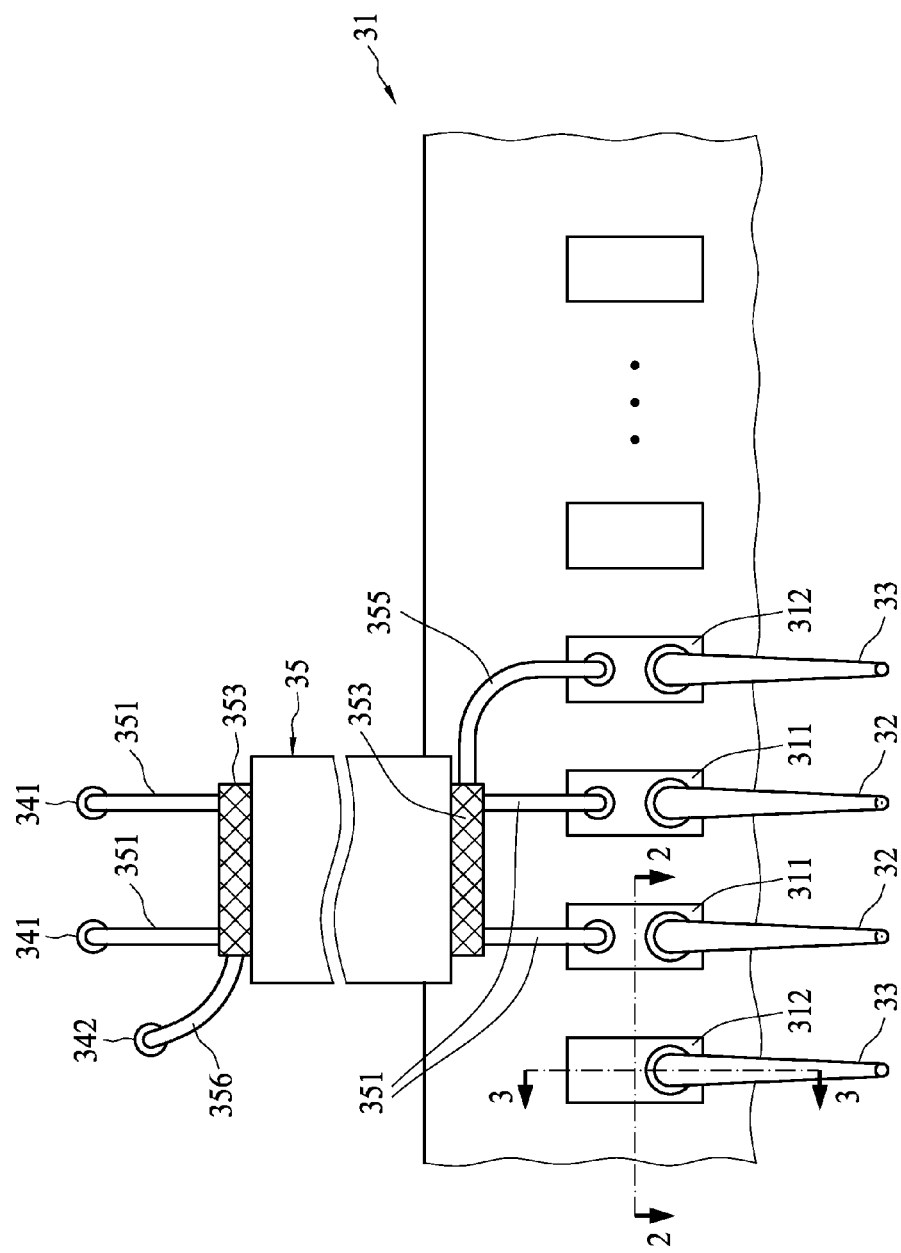
FIG. 5 is a schematic diagram showing the flexible substrate 31 according to one embodiment of the present disclosure.

FIG. 5 is a schematic diagram showing the flexible substrate 31 according to one embodiment of the present disclosure. The flexible substrate 31 comprises a plurality of conductive strips 311, 312 positioned on one surface of the flexible substrate 31 in an array manner The distal end of each probe 32, 33 is fixed on a respective conductive strip 311 or conductive strip 312 by soldering.

As shown in FIG. 5, the probes 32, 33 are fixed directly on the arrayed conductive strips 311, 312; therefore, the distal end of the probes 32, 33 are arranged in an orderly manner. In addition, because there are no disordered wire connections, the interference between the probes 32, 33 can be controlled. Furthermore, the size and the arrangement of the conductive strips 311, 312 can be changed in response to the size and the arrangement of the probes 32, 33; therefore, the probe card 3 can be applied to the electrical testing of the integrated circuit device with high-density pads. In addition, the flexible substrate 31 can be bent arbitrarily, and can be applied to the connection of probes 32, 33 with distal ends at different heights.

For example, in addition to being arranged linearly along a certain direction, the conductive strips 311, 312 can also be arranged in a staggered manner along the direction.

Referring to FIG. 4, the probe card 3 comprises a circuit board 34 and a coaxial cable 35, while the conductive strips 311, 312 of the flexible substrate 31 are connected to respective electrical terminals 341, 342 of the circuit board 34 via the coaxial cable 35 so as to transmit signals.

Referring to FIG. 5, the plurality of probes 32, 33 may include a signal probe 32 and a ground probe 33, the plurality of conductive strips 311, 312 include a first conductive strip 311 and a second conductive strip 312, the signal probe 32 is fixed on the first conductive strip 311, and the ground probe 33 is fixed on the second conductive strip 312.

Figure 6:
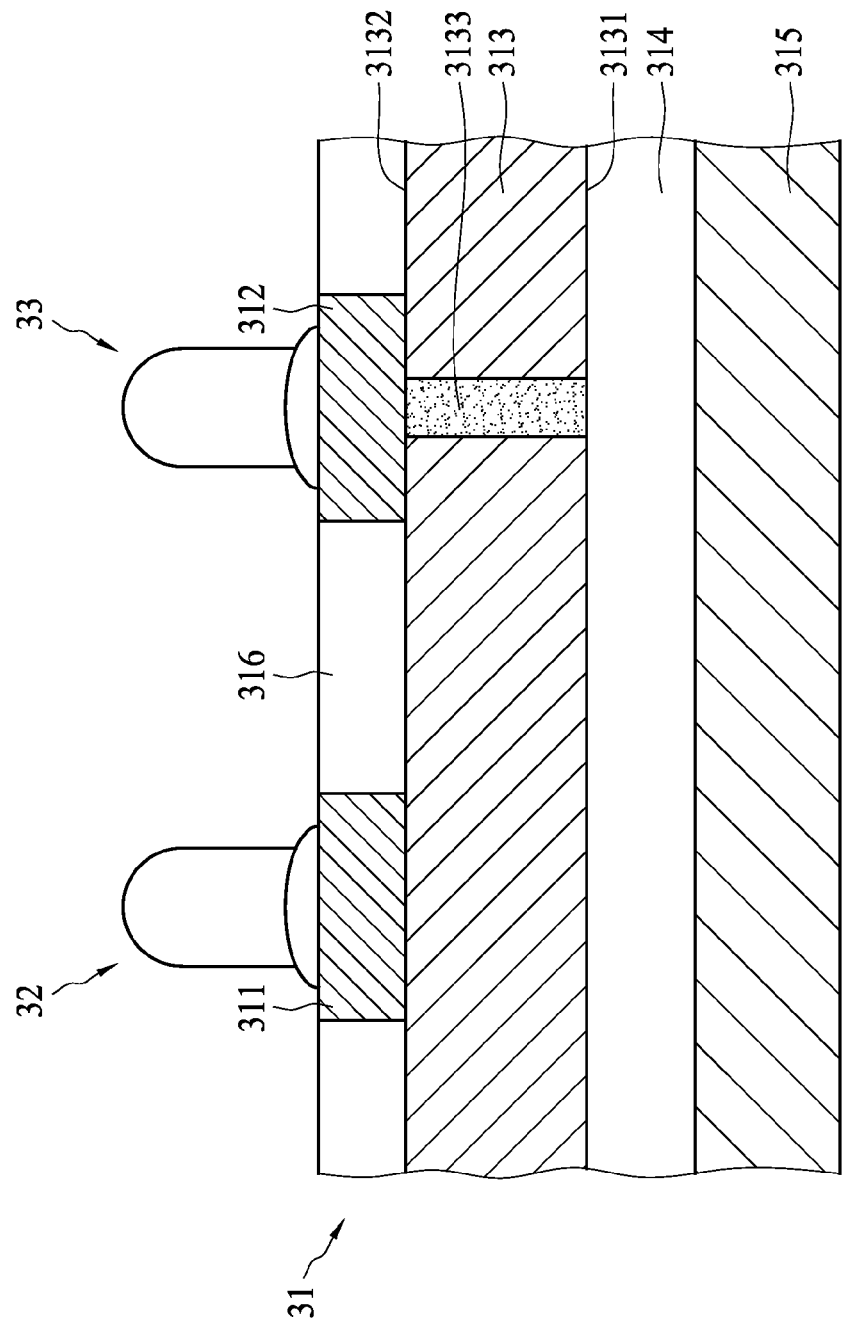
FIG. 6 is a cross-sectional view along line 2-2 of FIG. 5.

Referring to FIG. 6, the flexible substrate 31 includes a plate 313, a conductive layer 314, and an insulating layer 315. The plate 313 can be made of insulating material and has a first surface 3131, a second surface 3132, and at least one conductive pillar 3133. The conductive pillar 3133 is formed between the first surface 3131 and the second surface 3132 and penetrates through the plate 313.

The conductive layer 314 is formed on the first surface 3131 of the plate 313 and electrically connected to the conductive pillar 3133. The first conductive strip 311 and the second conductive strip 312 are separately positioned on the second surface 3132 of the plate 313, and the second conductive strip 312 is electrically connected to the conductive pillar 3133. The first conductive strip 311 and the second conductive strip 312 can be isolated by insulating material 316. In one embodiment of the present invention, the conductive layer 314, the first conductive strip 311 and the second conductive strip 312 comprise copper.

Figure 7:
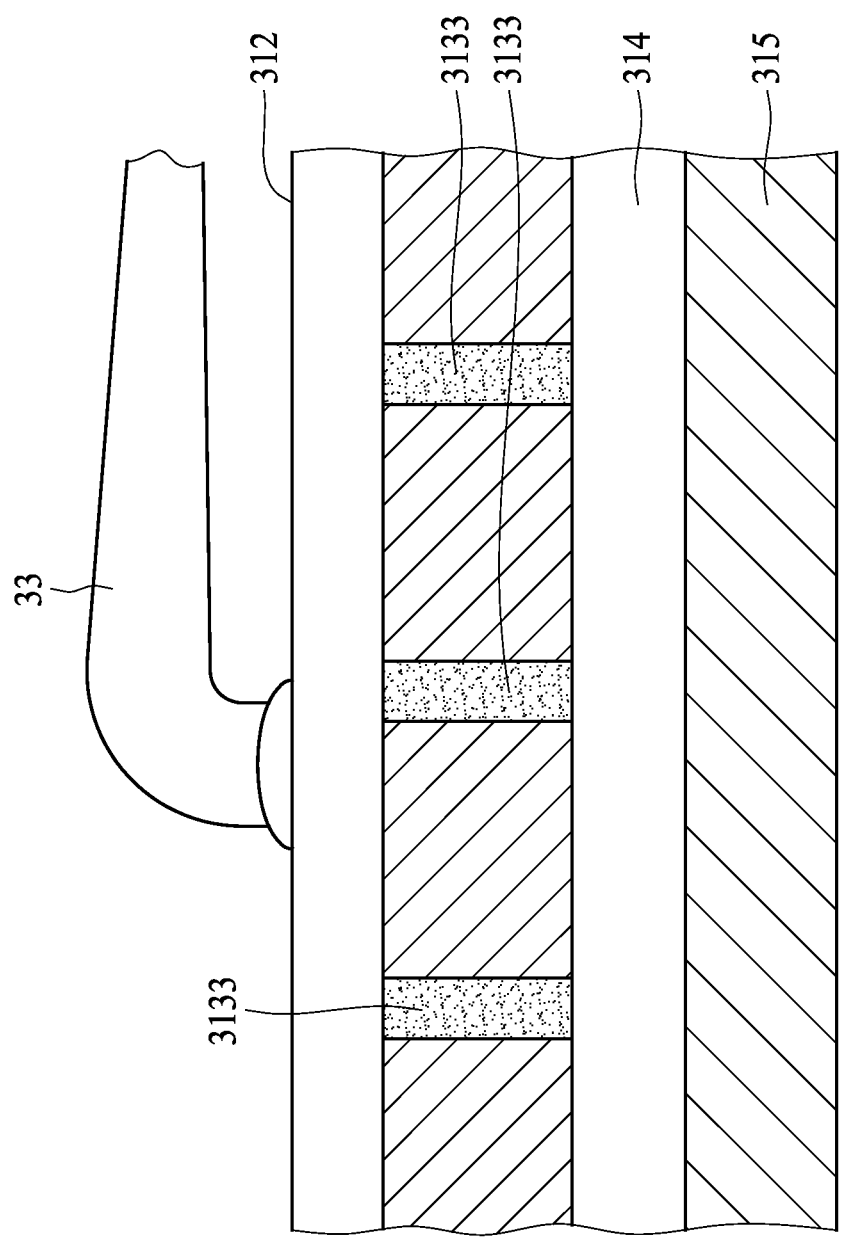
FIG. 7 is a cross-sectional view along line 3-3 of FIG. 5.

Referring to FIG. 7, each conductive strip 312 can be electrically connected to the conductive layer via a plurality of conductive pillars 3133, and the conductive pillars 3133 can be arranged along the second conductive strip 312.

Referring to FIGS. 3 to 5, the probe card 3 can be used to test a high-frequency integrated circuit device, particularly to the integrated circuit device with differential input/output signals. In one embodiment of the present invention, the probe card 3 comprises two signal probes 32 and two ground probes 33, and the flexible substrate 31 comprises two first conductive strips 311 and two second conductive strips 312.

Referring to FIG. 6 and FIG. 7, the two second conductive strips 312 can be electrically connected to the conductive layer 314 respectively via at least one conductive pillar 3133. The two signal probes 32 can be arranged in parallel and configured to transmit differential signals. The two signal probes 32 can be positioned between the two ground probes 33 to reduce interference of adjacent signal probes 32.

Referring to FIG. 5, the two signal probes 32 can be fixed on the first conductive strip 311, and the two ground probes 33 can be fixed on the second conductive strip 312. FIG. 3 illustrates a pair of signal probes 32 for transmitting differential signals, and the present disclosure can be applied to multiple pairs of differential signal probes.

Figure 8:
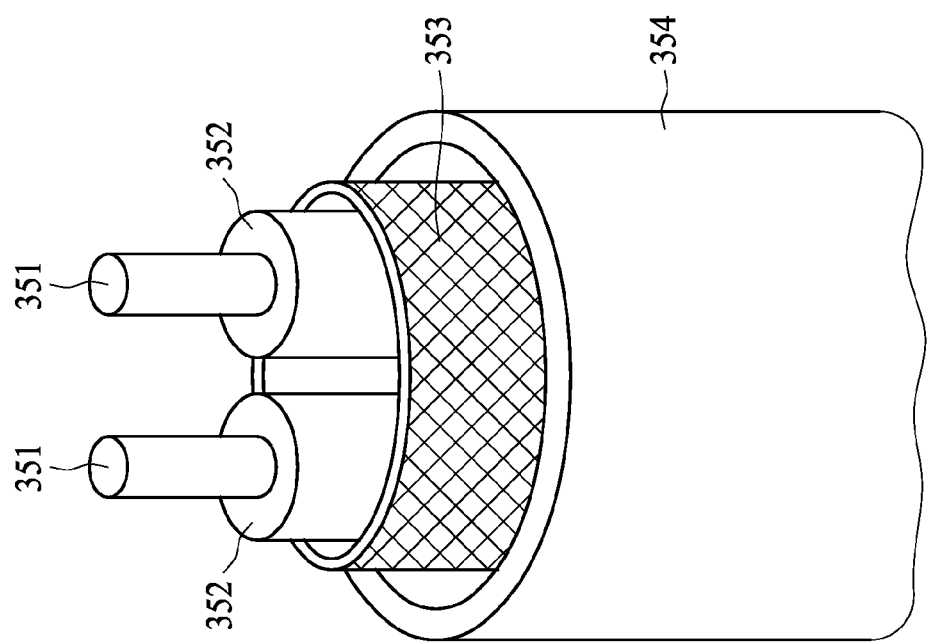
FIG. 8 is schematic diagram of the coaxial cable according to one embodiment of the present disclosure.

Referring to FIGS. 4 and 8, the probe card 3 may further comprise a coaxial cable 35. The coaxial cable 35 comprises two wires 351, two insulating layers 352, an electromagnetic shielding layer 353, and a surface layer 354. Each of the two wires 351 is covered by one of two insulating layers 352, the two insulating layers 352 are covered by the electromagnetic shielding layer 353, and the surface layer 354 encapsulates the electromagnetic shielding layer 353. The wire 351 can be implemented by a single solid metal line or by multiple twisted lines. The electromagnetic shielding layer 353 can be implemented by a network layer such as a metal network consisting of copper lines or aluminum lines.

Referring to FIG. 4 or FIG. 5, one end of the wire 351 is connected to the first conductive strip 311, the other end of the wire 351 is connected to an electrical terminal 341 of the circuit board 34, and the testing signals from the circuit board 34 can be transmitted to the signal probe 32.

In addition, the electromagnetic shielding layer 353 of the coaxial cable 35 can be connected to the second conductive strip 32 and the ground terminal 342 of the circuit board 34. Consequently, the electromagnetic shielding layer 353 of the coaxial cable 35 is connected to the ground, and the conductive layer 314 and the second conductive strip 312 of the flexible substrate 31 are also connected to the ground. Optionally, the grounding of the conductive layer 314 and the second conductive strip 312 may be implemented by directly connecting to the ground terminal 342, or by connecting the conductive layer 314 to the ground terminal 342.

In one embodiment of the present disclosure, the flexible substrate 31 has a first impedance and the coaxial cable 32 has a second impedance matched with the first impedance.

Referring to FIG. 4, the signal probe 32 and the ground probe 33 can be fixed on the circuit board 34 by a fixing member, which may include epoxy.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A probe card, comprising:
   a circuit board;
   a flexible substrate including a plurality of arrayed conductive strips electrically connected to the circuit board; and
   a plurality of probes fixed on the circuit board, wherein a distal end of each probe is connected to one corresponding conductive strip,
   wherein the plurality of probes includes at least one signal probe and at least one ground probe, the plurality of arrayed conductive strips includes at least a first conductive strip and a second conductive strip, and the flexible substrate includes:
a plate having a first surface and a second surface opposite to the first surface, wherein at least one conductive pillar penetrates the plate and is positioned between the first surface and the second surface; and
a conductive layer positioned on the first surface and electrically connected to the conductive pillar;
wherein the first conductive strip is positioned on the second surface, the signal probe is fixed on the first conductive strip, the second conductive strip is positioned on the second surface and electrically connected to the conductive pillar, and the ground probe is fixed on the second conductive strip.

2. The probe card of claim 1, comprising:
two first conductive strips and two second conductive strips;
two ground probes, wherein each of the two ground probes is fixed on one of the two second conductive strips; and
two signal probes positioned between the two ground probes, wherein each of the two signal probes is fixed on one of the two first conductive strips.

3. The probe card of claim 2, further comprising a coaxial cable, the coaxial cable comprising:
two wires, wherein each of the two wires is connected to one of the two first conductive strips;
two insulating layers, wherein each of the two insulating layers covers one of the two wires;
an electromagnetic shielding layer surrounding the two insulating layers; and
a surface layer encapsulating the electromagnetic shielding layer.

4. The probe card of claim 3, wherein the flexible substrate has a first impedance and the coaxial cable has a second impedance matched with the first impedance.

5. The probe card of claim 4, further comprising a fixing member configured to fix the two ground probes and the two signal probes on the circuit board.

6. The probe card of claim 5, wherein the circuit board further comprises a ground terminal, and the conductive layer is electrically connected to the ground terminal.

7. The probe card of claim 6, wherein the electromagnetic shielding layer of the coaxial cable electrically connects the second conductive strip and the ground terminal of the circuit board.

8. The probe card of claim 7, wherein the circuit board further comprises a plurality of electrical terminals, one end of the wire is connected to the first conductive strip, and the other end of the wire is connected to a respective electrical terminal.

9. The probe card of claim 8, wherein the conductive layer, the first conductive strip, and the second conductive strip comprise copper.

* * * * *